(12) United States Patent  (10) Patent No.: US 8,664,656 B1
Arnold et al.  (45) Date of Patent: Mar. 4, 2014

(54) DEVICES AND METHODS FOR EMBEDDING SEMICONDUCTORS IN PRINTED CIRCUIT BOARDS

(71) Applicant: Apple Inc., Cupertino, CA (US)

(72) Inventors: Shawn X. Arnold, Santa Cruz, CA (US); Dennis Pyper, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/644,280

(22) Filed: Oct. 4, 2012

(51) Int. Cl.
  *H01L 23/58* (2006.01)
  *H01L 27/15* (2006.01)
  *H01L 29/84* (2006.01)
  *H01L 23/48* (2006.01)

(52) U.S. Cl.
  USPC ............... 257/48; 257/81; 257/416; 257/690

(58) Field of Classification Search
  USPC .............................. 257/48, 81, 690; 361/795
  See application file for complete search history.

(56) References Cited

U.S. PATENT DOCUMENTS

| | | | |
|---|---|---|---|
| 6,222,740 B1 * | 4/2001 | Bovensiepen et al. | 361/795 |
| 8,020,292 B1 | 9/2011 | Kumar et al. | |
| 8,112,880 B2 | 2/2012 | Zhang et al. | |
| 8,115,297 B2 | 2/2012 | Yang | |
| 8,152,953 B2 | 4/2012 | Yoshimura et al. | |
| 2004/0238209 A1 * | 12/2004 | Yuri et al. | 174/257 |
| 2007/0227765 A1 * | 10/2007 | Sakamoto et al. | 174/260 |
| 2008/0055872 A1 * | 3/2008 | Inagaki et al. | 361/760 |
| 2008/0237828 A1 * | 10/2008 | Yang | 257/690 |
| 2009/0241332 A1 * | 10/2009 | Lauffer et al. | 29/829 |
| 2010/0078655 A1 * | 4/2010 | Yang | 257/81 |

* cited by examiner

*Primary Examiner* — Long K Tran
*Assistant Examiner* — Dzung Tran (57) ABSTRACT

Methods and devices for embedding semiconductors in printed circuit boards (PCBs) are provided. In one example, a method of manufacturing a PCB having a die assembly embedded therein includes removing a release film from an adhesive layer of the die assembly. The method also includes disposing the die assembly on a first layer of the PCB such that the adhesive layer contacts the first layer of the PCB. The method includes disposing a second layer of the PCB over the first layer such that the die assembly is within an intermediate portion between the first layer and the second layer. The method also includes filling the intermediate portion with resin and subjecting the PCB to a press cycle to cure the resin.

12 Claims, 5 Drawing Sheets

DEVICES AND METHODS FOR EMBEDDING SEMICONDUCTORS IN PRINTED CIRCUIT BOARDS

BACKGROUND

The present disclosure relates generally to printed circuit boards (PCBs) and, more particularly, to devices and methods for embedding semiconductors in PCBs.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

PCBs are commonly used in a wide variety of electronic devices, including such consumer electronics as televisions, computers, and handheld devices (e.g., cellular telephones, audio and video players, gaming systems, and so forth). It may be desirable to miniaturize electronic devices to facilitate convenient use of the devices. For example, in the cellular telephone industry, smaller phones may be desirable because users can more easily transport and store a phone that takes up less space.

Furthermore, miniaturization may facilitate inclusion of additional features in a single device, which may be advantageous because it eliminates the need for multiple devices. Indeed, miniaturization of a device may include more effectively utilizing available space for a particular component, which makes space available for additional components. For example, if certain components of an audio player are reduced in size, the space previously occupied by the now miniaturized components may be utilized for an additional feature, such as camera circuitry, cell phone circuitry, a sound recorder, or the like. To facilitate miniaturization in certain electronic devices, semiconductor devices (e.g., dies) may be embedded inside a PCB. During manufacturing of PCBs with embedded semiconductor devices, a semiconductor device is accurately positioned in a PCB to enable good electrical communication between the semiconductor device and traces of the PCB.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for accurately embedding semiconductors in printed circuit boards (PCBs) to enable good electrical communication between the embedded semiconductors and the PCBs. By way of example, a method of manufacturing a PCB having a die assembly embedded therein includes removing a release film from an adhesive layer of the die assembly. The method also includes disposing the die assembly on a first layer of the PCB such that the adhesive layer contacts the first layer of the PCB. The method includes disposing a second layer of the PCB over the first layer such that the die assembly is within an intermediate portion between the first layer and the second layer. The method also includes filling the intermediate portion with resin and subjecting the PCB to a press cycle to cure the resin.

Various refinements of the features noted above may be made in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure will be described below. These described embodiments are only examples of the presently disclosed techniques.

Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, embodiments of the present disclosure relate to electronic devices incorporating printed circuit boards (PCBs), such as PCBs that include electrical routing circuits and semiconductor devices (e.g., dies) for the electronic devices. Specifically, the PCBs include embedded dies that are attached to the PCB using an adhesive layer. As will be appreciated, if the adhesive layer is applied directly to the PCB, then when the die is placed on the adhesive layer, the die may twist, move, and/or slide to an undesirable position. Accordingly, the dies may be manufactured to include an adhesive layer so that when they are removed from a roll of dies, the die may attach directly to a PCB and may be held in place to the PCB via the adhesive layer.

Figure 1:
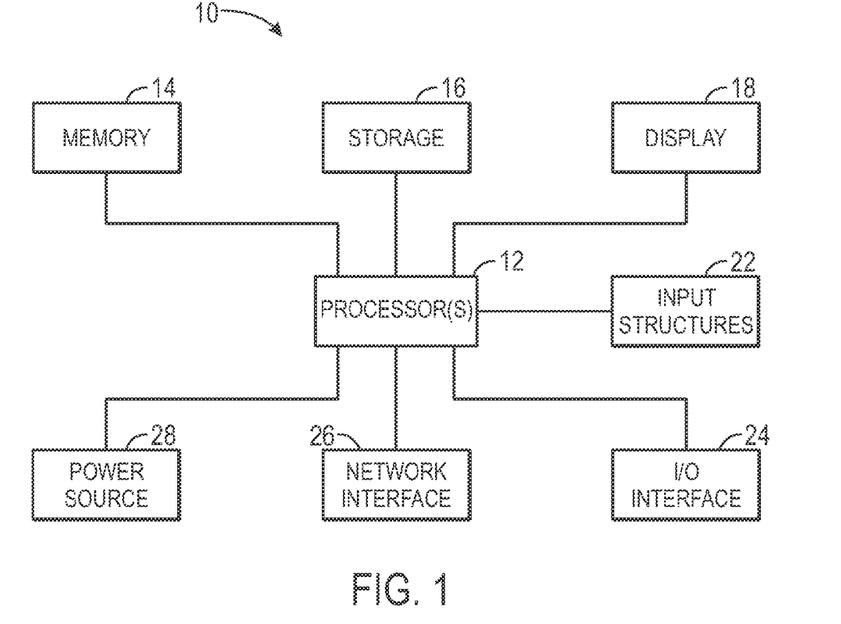
FIG. 1 is a schematic block diagram of an electronic device that may include a printed circuit board (PCB) having an embedded die assembly, in accordance with an embodiment.
Figure 2:
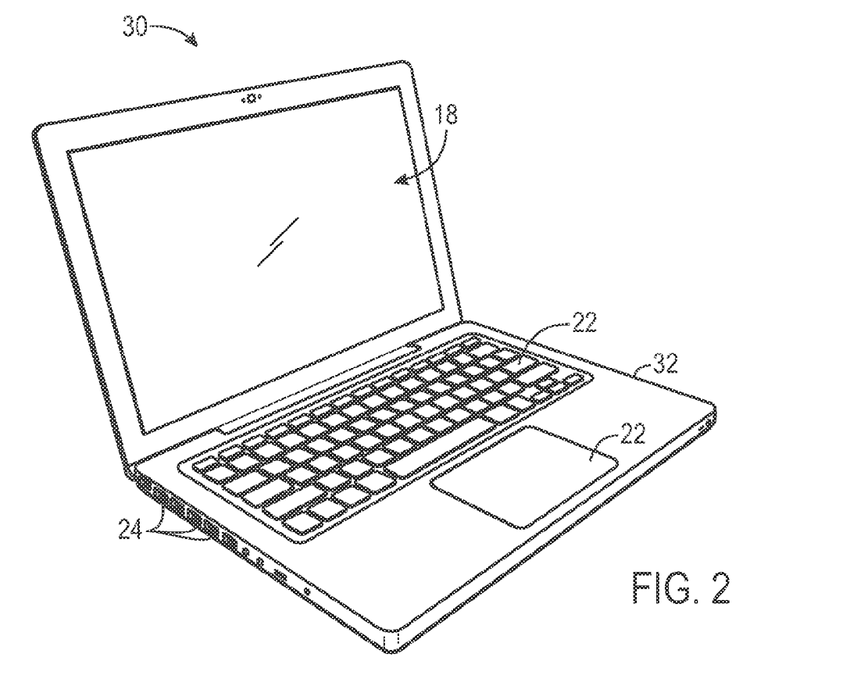
FIG. 2 is a perspective view of a notebook computer representing an embodiment of the electronic device of FIG. 1.
Figure 3:
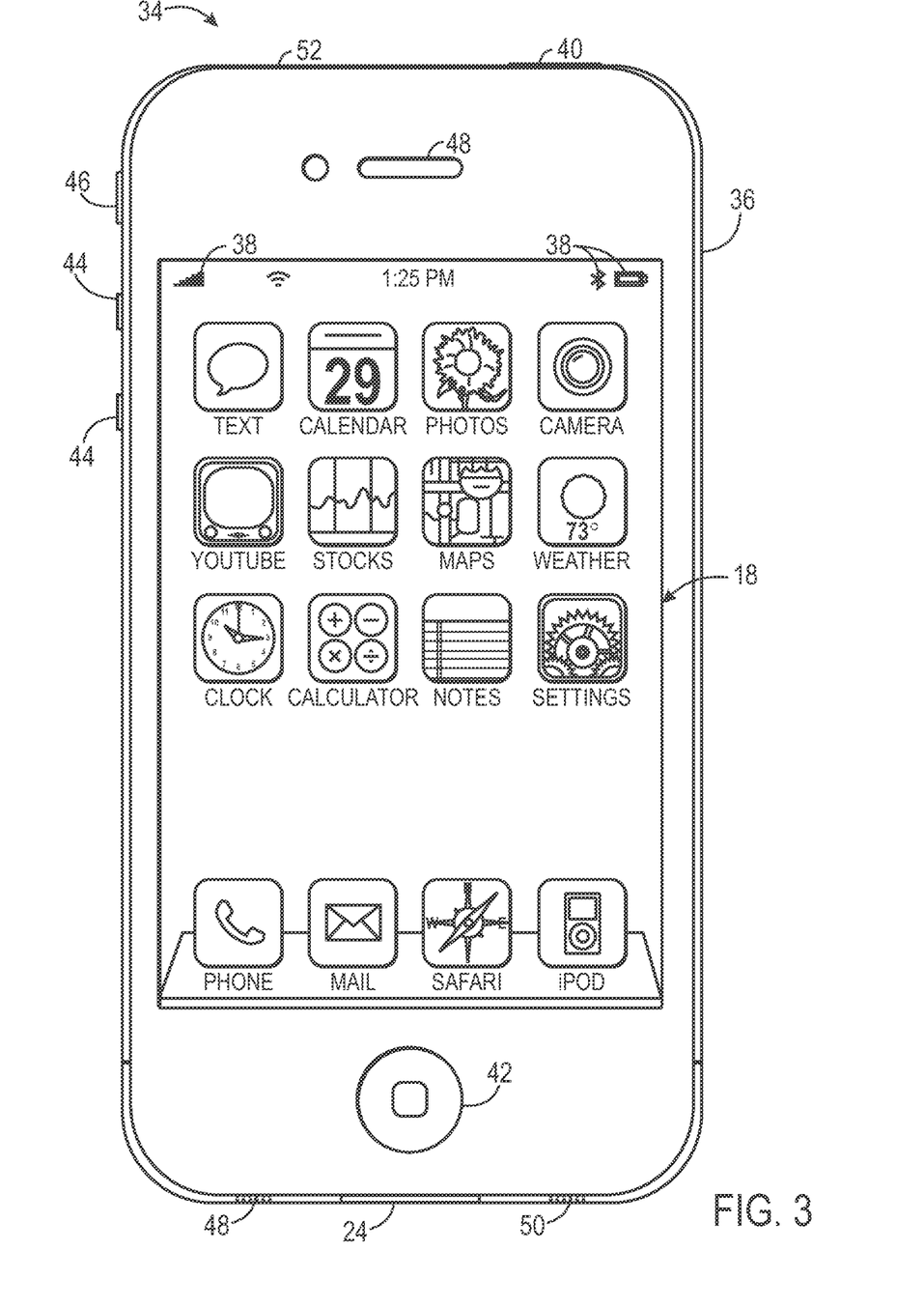
FIG. 3 is a front view of a handheld device representing another embodiment of the electronic device of FIG. 1.

With the foregoing in mind, a general description of suitable electronic devices that may employ PCBs with embedded dies will be provided below. In particular, FIG. 1 is a block diagram depicting various components that may be present in an electronic device suitable for incorporating such a PCB. FIGS. 2 and 3 respectively illustrate perspective and front views of a suitable electronic device, which may be, as illustrated, a notebook computer or a handheld electronic device.

Turning first to FIG. 1, an electronic device 10 according to an embodiment of the present disclosure may include, among other things, one or more processor(s) 12, memory 14, nonvolatile storage 16, a display 18, input structures 22, an input/output (I/O) interface 24, network interfaces 26, and a power source 28. The various functional blocks shown in FIG. 1 may include hardware elements (including circuitry), software elements (including computer code stored on a computer-readable medium) or a combination of both hardware and software elements. It should be noted that FIG. 1 is merely one example of a particular implementation and is intended to illustrate the types of components that may be present in the electronic device 10. As will be appreciated, any portion of the electronic device 10 may include PCBs to perform specific functions. Furthermore, if embedded dies are not properly oriented within the PCBs, the electronic device 10 may not function properly. As such, embodiments of the present disclosure may be employed to embed dies within PCBs in a manner to inhibit the dies from twisting, moving, and/or sliding out of place.

By way of example, the electronic device 10 may represent a block diagram of the notebook computer depicted in FIG. 2, the handheld device depicted in FIG. 3, or similar devices. It should be noted that the processor(s) 12 and/or other data processing circuitry may be generally referred to herein as "data processing circuitry." This data processing circuitry may be embodied wholly or in part as software, firmware, hardware, or any combination thereof. Furthermore, the data processing circuitry may be a single contained processing module or may be incorporated wholly or partially within any of the other elements within the electronic device 10. As presented herein, the data processing circuitry may control the electronic display 18.

In the electronic device 10 of FIG. 1, the processor(s) 12 and/or other data processing circuitry may be operably coupled with the memory 14 and the nonvolatile memory 16 to execute instructions. Such programs or instructions executed by the processor(s) 12 may be stored in any suitable article of manufacture that includes one or more tangible, computer-readable media at least collectively storing the instructions or routines, such as the memory 14 and the nonvolatile storage 16. The memory 14 and the nonvolatile storage 16 may include any suitable articles of manufacture for storing data and executable instructions, such as random-access memory, read-only memory, rewritable flash memory, hard drives, and optical discs. Also, programs (e.g., an operating system) encoded on such a computer program product may include instructions that may be executed by the processor(s) 12.

The display 18 may be a touch-screen liquid crystal display (LCD), for example, which may enable users to interact with a user interface of the electronic device 10. In some embodiments, the electronic display 18 may be a MultiTouch™ display that can detect multiple touches at once. Furthermore, the display 18 may be communicatively coupled to the processor(s) 12 to send and/or receive data. The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interfaces 26. The network interfaces 26 may include, for example, interfaces for a personal area network (PAN), such as a Bluetooth network, for a local area network (LAN), such as an 802.11x Wi-Fi network, and/or for a wide area network (WAN), such as a 3G or 4G cellular network. The power source 28 of the electronic device 10 may be any suitable source of power, such as a rechargeable lithium polymer (Li-poly) battery and/or an alternating current (AC) power converter.

The electronic device 10 may take the form of a computer or other type of electronic device. Such computers may include computers that are generally portable (such as laptop, notebook, and tablet computers) as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® mini, or Mac Pro® available from Apple Inc. By way of example, the electronic device 10, taking the form of a notebook computer 30, is illustrated in FIG. 2 in accordance with one embodiment of the present disclosure. The depicted computer 30 may include a housing 32, a display 18, input structures 22, and ports of an I/O interface 24. The display 18 may be coupled to the housing 32. In one embodiment, the input structures 22 (such as a keyboard and/or touchpad) may be used to interact with the computer 30, such as to start, control, or operate a GUI or applications running on computer 30. For example, a keyboard and/or touchpad may allow a user to navigate a user interface or application interface displayed on the display 18. Further, the computer 30 may include PCBs manufactured using the methods described in detail below.

FIG. 3 depicts a front view of a handheld device 34, which represents one embodiment of the electronic device 10. The handheld device 34 may represent, for example, a portable phone, a media player, a personal data organizer, a handheld game platform, or any combination of such devices. By way of example, the handheld device 34 may be a model of an iPod® or iPhone® available from Apple Inc. of Cupertino, Calif. In other embodiments, the handheld device 34 may be a tablet-sized embodiment of the electronic device 10, which may be, for example, a model of an iPad® available from Apple Inc.

The handheld device 34 may include an enclosure 36 (e.g., housing) to protect interior components from physical damage and to shield them from electromagnetic interference. The enclosure 36 may surround and/or be attached to the display 18, which may display indicator icons 38. The indicator icons 38 may indicate, among other things, a cellular signal strength, Bluetooth connection, and/or battery life. The I/O interfaces 24 may open through the enclosure 36 and may include, for example, a proprietary I/O port from Apple Inc. to connect to external devices.

User input structures 40, 42, 44, and 46, in combination with the display 18, may allow a user to control the handheld device 34. For example, the input structure 40 may activate or deactivate the handheld device 34, the input structure 42 may navigate a user interface to a home screen, a user-configurable application screen, and/or activate a voice-recognition feature of the handheld device 34, the input structures 44 may provide volume control, and the input structure 46 may toggle between vibrate and ring modes. A microphone 48 may obtain a user's voice for various voice-related features, and a speaker 50 may enable audio playback and/or certain phone capabilities. A headphone input 52 may provide a connection to external speakers and/or headphones. As mentioned above, the handheld device 34 may include PCBs manufactured using the methods described in detail below.

Figure 4:
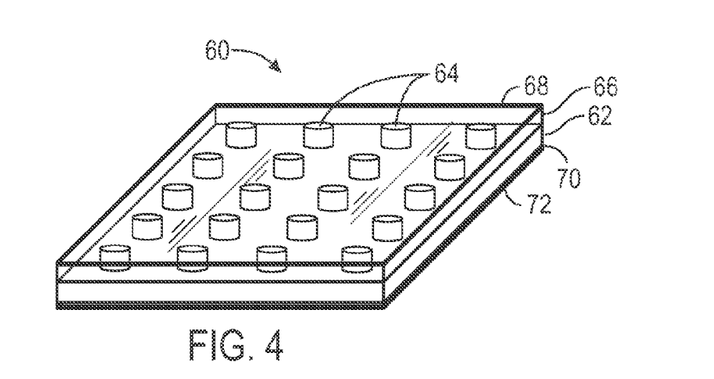
FIG. 4 is a perspective view of a die assembly with an integrated attachment layer that may be embedded in a PCB, in accordance with an embodiment.

PCBs may be manufactured to include embedded dies to perform various functions of the electronic device 10. Accordingly, FIG. 4 illustrates a die assembly 60 that may be embedded within a PCB. The die assembly 60 may be any suitable electrical component, such as a silicon based device, a passive device (e.g., capacitor, resistor, inductor), an active device (e.g., transistor, rectifier), an integrated circuit (IC), and so forth. Specifically, the die assembly 60 includes a die 62 having conductive pads 64 (e.g., copper posts, contacts). In certain embodiments, the conductive pads 64 may extend approximately 10 to 25 um above a surface of the die 62. A molding tape 66 may be disposed around the conductive pads 64. In some embodiments, the molding tape 66 may have a thickness of approximately 10 to 25 um. Furthermore, the molding tape may have a co-efficient of thermal expansion (CTE) of approximately 1 to 20 ppm/deg C.

The molding tape 66 may be supplied from a sheet or roll and may be uncured. Being uncured, the molding tape 66 may remain soft such that when it is pressed onto the conductive pads 64 it fills the area around the conductive pads 64. As will be appreciated, the molding tape 66 may be cured via a pressure, temperature, and/or ultra-violet (UV) process. In certain embodiments, the molding tape 66 may buffer the expansion and/or contraction of the materials surrounding the molding tape 66. It should be noted that after applying the molding tape 66, the molding tape 66 and the conductive pads 64 may form a generally flat surface for applying additional layers to the die assembly 60. For example, a top film 68 may be applied over the molding tape 66 for storage and/or protection of the die assembly 60. The top film 68 may be any suitable film such as a release film or tape. In certain embodiments, an adhesive layer may be disposed between the molding tape 66 and the top film 68.

As will be appreciated, an adhesive may be applied to a surface where the die 62 is to be attached. In such configurations, the adhesive may be applied using a silk-screening and/or a photolithography process. With such processes, the adhesive tends to be applied as a thick layer and when a die 62 is placed thereon, the die 62 tends to move, twist, and/or slide. In contrast, in the present embodiment an adhesive layer 70 (e.g., a thin layer of adhesive) is disposed on the die 62 on a side of the die 62 opposite the conductive pads 64. The adhesive layer 70 is used to attach the die 62 to another surface, such as part of a PCB, as explained in detail below. By disposing the adhesive layer 70 directly on the die 62, the die 62 may be attached to another surface without applying an adhesive to the surface to which the die 62 is to be attached. Accordingly, when the die 62 with the adhesive layer 70 is placed onto a surface to be attached, movement, twisting, and/or sliding of the die 62 may be reduced and/or eliminated. It should be noted that the resistance to movement, twisting, and/or sliding may be due in part to the adhesive layer 70 being applied as a thin layer. As explained above, less adhesive is between the die 62 and the PCB than in configurations where the adhesive layer is applied directly to the PCB.

Figure 5:
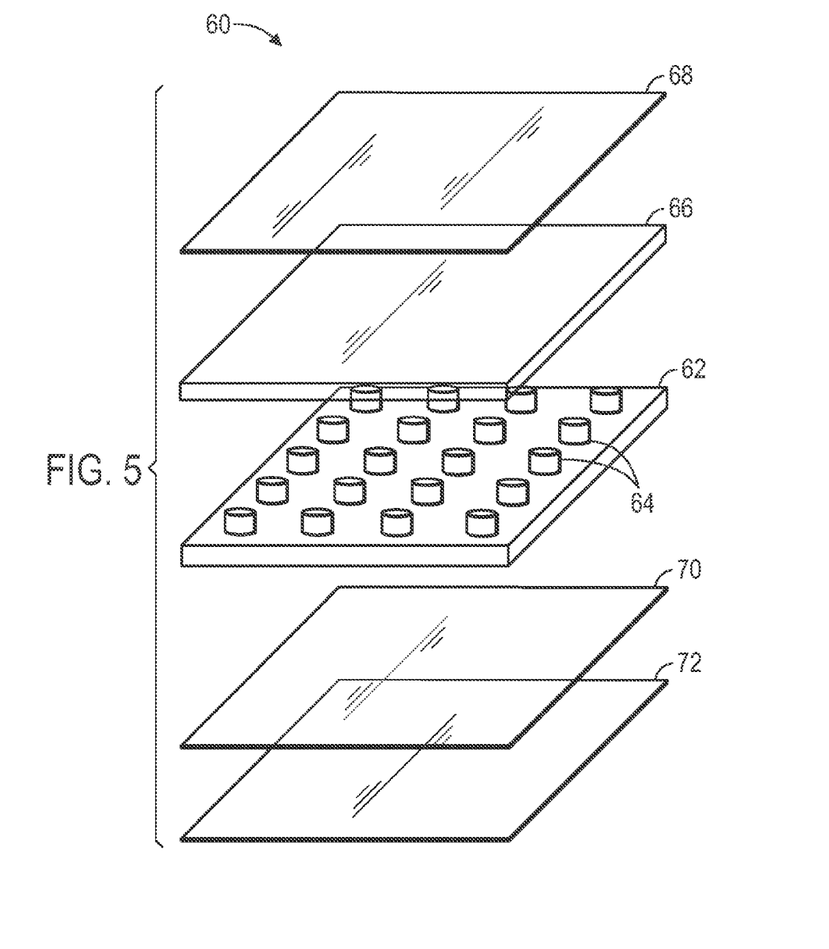
FIG. 5 is an exploded view of the die assembly of FIG. 4, in accordance with an embodiment.

The die assembly 60 may include a bottom film 72 that may be applied on the adhesive layer 70 for storage and/or protection of the die assembly 60. The bottom film 72 may be any suitable film such as a release film or tape. In certain embodiments, the film 72 and/or the film 68 may be part of a roll of film. In such embodiments, multiple die assemblies 60 may be manufactured and be placed on the roll of film such that the films 68 and 72 are part of the roll of film. During manufacturing where the die assemblies 60 from a roll of film are used, the die assemblies 60 may first be removed from the roll of film (e.g., by a pick and place machine). For example, a die assembly 60 from a roll of film may be removed from the roll of film and disposed into a PCB assembly. As will be appreciated, when the die assembly 60 is removed from the roll of film, the film layers 68 and 72 are removed from the die assembly 60. As illustrated, FIG. 5 depicts an exploded view of the die of FIG. 4.

Figure 6:
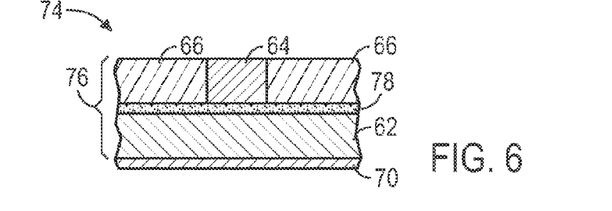
FIG. 6 is a partial cross-sectional view of another die assembly with an integrated attachment layer that may be embedded in a PCB, in accordance with an embodiment.

The die assembly 60 is one embodiment of layers, including the adhesive layer 70, which may be formed on the die 62. Moreover, FIG. 6 is a partial cross-sectional view of another die assembly 74 that may be embedded in a PCB. As illustrated, the die assembly 74 includes a die portion 76 and the adhesive layer 70. Furthermore, the die portion 76 includes the die 62, the conductive pads 64, and the molding tape 66. In the present embodiment, the die portion 76 includes a redistribution layer (RDL) 78. In some embodiments, the RDL 78 may be hydroscopic (e.g., a polymide) to absorb water. In other embodiments, the RDL 78 may be omitted from the die portion 76. As discussed above, with the adhesive layer 70 applied to the die portion 76, movement, twisting, and/or sliding of the die 62 may be reduced and/or eliminated when the die assembly 60 is placed onto another surface.

Figure 7:
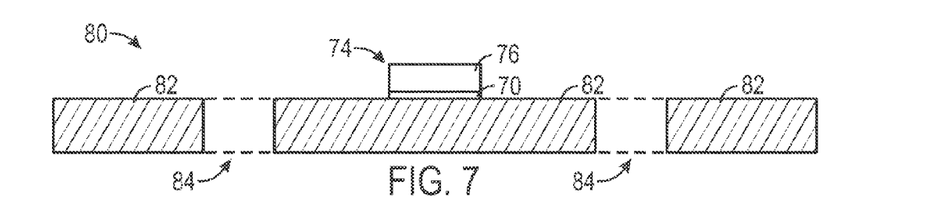
FIG. 7 is a cross-sectional view of a stage in a method for manufacturing a PCB with a die assembly having an integrated adhesive layer, in accordance with an embodiment.

As discussed above, a die assembly (e.g., die assemblies 60 and 74) may be manufactured within (e.g., embedded into) a PCB. FIGS. 7 through 10 illustrate one method for manufacturing a PCB with an integrated adhesive layer. Accordingly, FIG. 7 is a cross-sectional view of a stage 80 in the method for manufacturing a PCB with the die assembly 74 having the integrated adhesive layer 70. During stage 80, the die assembly 74 is disposed on a first layer 82 of a PCB. As illustrated, the adhesive layer 70 of the die assembly 74 is disposed such that the adhesive layer 70 contacts the first layer 82 of the PCB. Moreover, the conductive pads 64 of the die assembly 74 are on the opposite side of the die assembly 74 from the adhesive layer 70. As such, the conductive pads 64 are positioned to extend up and are in a "pads-up" position.

In certain embodiments, before the die assembly 74 is disposed on the first layer 82 of the PCB, a film (e.g., release film such as films 68 and 72) may be removed from the adhesive layer 70 to expose the adhesive layer 70 of the die assembly 74 for attachment. For example, the die assembly 74 may be removed from a roll of film that includes multiple die assemblies 74. Furthermore, in some embodiments, a pick and place machine may remove the die assembly 74 from the roll of film and place the die assembly 74 on the first layer 82 of the PCB.

The first layer 82 of the PCB may be any suitable PCB layer. For example, in certain embodiments the first layer 82 may include a core layer, a prepreg or B-stage layer, a conductive layer (e.g., copper foil, conductive traces), and/or a sacrificial layer. Furthermore, as will be appreciated, the core layer and/or the prepreg layer may include materials such as FR-2, FR-3, FR-4, FR-5, FR-6, G-10, CEM-1, CEM-2, CEM-3, CEM-4, CEM-5, and so forth. As illustrated, the first layer 82 includes alignment features 84 that are used to align the first layer 82 with additional layers of the PCB. In certain embodiments, the alignment features 84 may include openings and/or holes that align with openings and/or holes of additional layers.

Figure 8:
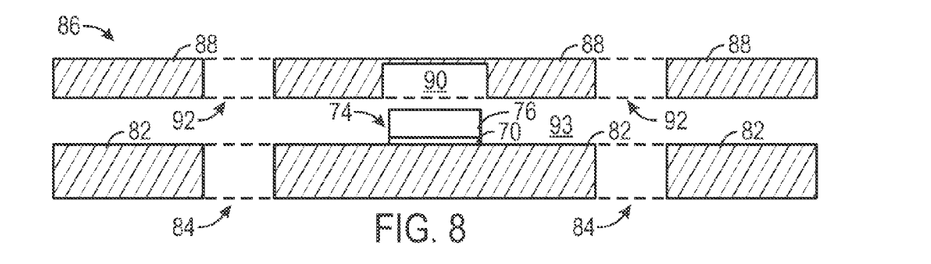
FIG. 8 is a cross-sectional view of another stage in the method of FIG. 7 for manufacturing the PCB, in accordance with an embodiment.

During stage 86 in the method for manufacturing the PCB, a second layer 88 is disposed over and aligned with the first layer 82, as illustrated in FIG. 8. Specifically, a cavity 90 is aligned with the die assembly 74. Furthermore, the second layer 88 includes alignment features 92 that are used to align the second layer 88 with the alignment features 84 of the first layer 82, and therefore align the first layer 82 with the second layer 88. In certain embodiments, the alignment features 92 may include openings and/or holes that align with openings and/or holes of the first layer 82.

The second layer 88 is disposed over the first layer 82 such that the die assembly 74 is within (e.g., between) the first layer 82 and the second layer 88 (e.g., in an intermediate portion 93, middle portion, center portion, central portion of the PCB). The second layer 88 of the PCB may be any suitable PCB layer. For example, in certain embodiments the second layer 88 may include a core layer, a prepreg or B-stage layer, a conductive layer (e.g., copper foil, conductive traces), and/or a sacrificial layer.

Figure 9:
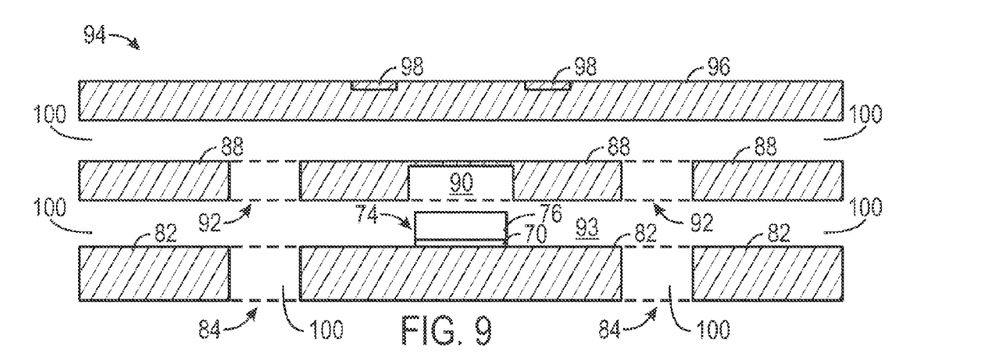
FIG. 9 is a cross-sectional view of a further stage in the method of FIG. 7 for manufacturing the PCB, in accordance with an embodiment.

During stage 94 in the method for manufacturing the PCB, a third layer 96 is disposed over and aligned with the second layer 88 and/or the first layer 82, as illustrated in FIG. 9. The third layer 96 of the PCB may be any suitable PCB layer. For example, in certain embodiments the third layer 96 may include a core layer, a prepreg or B-stage layer, a conductive layer (e.g., copper foil, conductive traces), and/or a sacrificial layer.

In the present embodiment, the third layer 96 includes test pads 98. The test pads 98 may be used to test the PCB assembly after the first, second, and third layers 82, 88, and 96 are attached together (e.g., via a press cycle). Accordingly, the test pads 98 may be used to test (e.g., verify the correct operation of) the die assembly 74. A resin (e.g., epoxy) is used to fill the intermediate portion 93 and other gaps between the first, second, and third layers 82, 88, and 96 to attach the layers together. For example, the resin may be directed through one or more of openings 100 to fill the gaps between the layers. While the resin fills the intermediate portion 93, or shortly after the resin in injected, the PCB assembly is subjected to one or more press cycles and/or heat cycles to hold the layers 82, 88, and 96 together and to cure the resin. In certain embodiments, the PCB assembly is subjected to a single press cycle which may take approximately six to eight hours. Using a single press cycle may reduce manufacturing time in comparison to manufacturing processes that use more than one press cycle, thereby reducing the time taken to form the PCB assembly.

Figure 10:
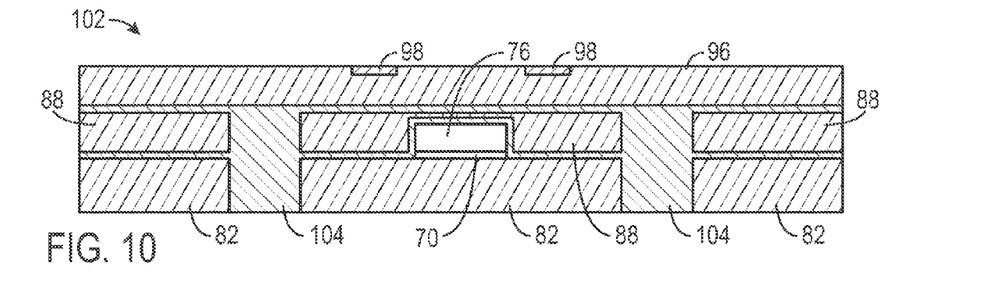
FIG. 10 is a cross-sectional view of the PCB formed using the method of FIG. 7 for manufacturing the PCB, in accordance with an embodiment.

Accordingly, a PCB assembly 102 is formed, as illustrated in FIG. 10. The PCB assembly 102 includes cured resin 104 disposed between the layers 82, 88, and 96 and attaching the layers together. As will be appreciated, the cured resin 104 is configured to inhibit liquids (e.g., water) from contacting the die assembly 74. As illustrated, the PCB assembly 102 includes the die assembly 74 embedded therein. The conductive pads 64 of the die assembly 74 may be coupled to conductive traces disposed in the second layer 88 so that signals may be applied to the conductive pads 64. Furthermore, the conductive traces of the PCB assembly 102 may be arranged so that the die assembly 74 may be tested by accessing the test pads 98. Therefore, the operation of the die assembly 74 may be tested by using the test pads 98.

Figure 11:
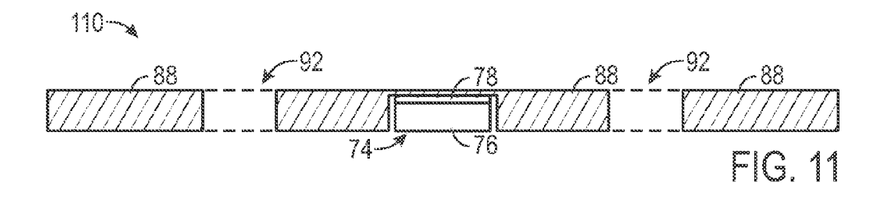
FIG. 11 is a cross-sectional view of a stage in another method for manufacturing a PCB with a die assembly having an integrated adhesive layer, in accordance with an embodiment.
Figure 12:
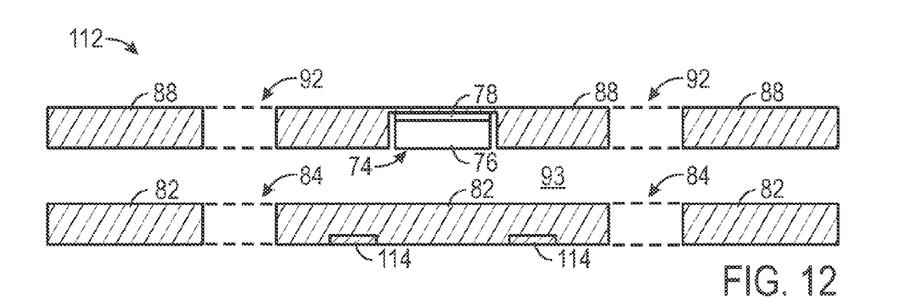
FIG. 12 is a cross-sectional view of a further stage in the method of FIG. 11 for manufacturing the PCB, in accordance with an embodiment.

The PCB assembly 102 is manufactured by disposing the die assembly 74 on the first layer 82 as shown in FIGS. 7 through 10. In contrast, FIGS. 11 through 14 illustrate another method for manufacturing a PCB where the die assembly 74 is disposed on the second layer 88. Accordingly, FIG. 11 is a cross-sectional view of stage 110 in the method for manufacturing a PCB with the die assembly 74 disposed on the second layer 88. As such, the adhesive layer 70 of the die assembly 74 is attached to the second layer 88. Furthermore, the adhesive layer 70 of the die assembly 74 is disposed such that the adhesive layer 70 contacts the second layer 88 of the PCB. Moreover, the conductive pads 64 of the die assembly 74 are on the opposite side of the die assembly 74 from the adhesive layer 70. Therefore, the conductive pads 64 are positioned to extend down and are in a "pads-down" position. During stage 112, the second layer 88 is disposed over and aligned with the first layer 82, as illustrated in FIG. 12. Furthermore, in the present embodiment, the first layer 82 includes test pads 114 for testing the operation of the die assembly 74 after the PCB layers are attached together.

Figure 13:
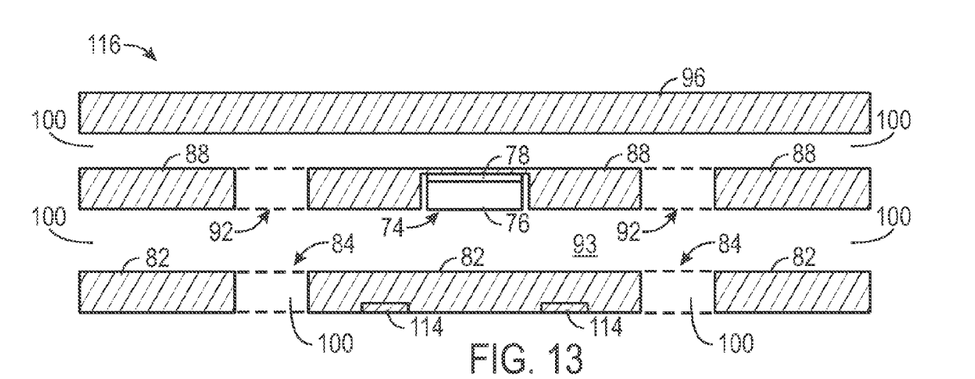
FIG. 13 is a cross-sectional view of another stage in the method of FIG. 11 for manufacturing the PCB, in accordance with an embodiment.

During stage 116, the third layer 96 is disposed over and aligned with the second layer 88 and/or the first layer 82, as illustrated in FIG. 13. A resin (e.g., epoxy) is used to fill the intermediate portion 93 and other gaps between the first, second, and third layers 82, 88, and 96 to attach the layers together. For example, the resin may be directed through one or more of the openings 100 to fill the gaps between the layers. While the resin fills the intermediate portion 93, or shortly after the resin in injected, the PCB assembly is subjected to one or more press cycles and/or heat cycles to hold the layers 82, 88, and 96 together and to cure the resin. In certain embodiments, the PCB assembly is subjected to a single press cycle which may take approximately six to eight hours. Using a single press cycle may reduce manufacturing time in comparison to manufacturing processes that use more than one press cycle, thereby reducing the time taken to form the PCB assembly.

Figure 14:
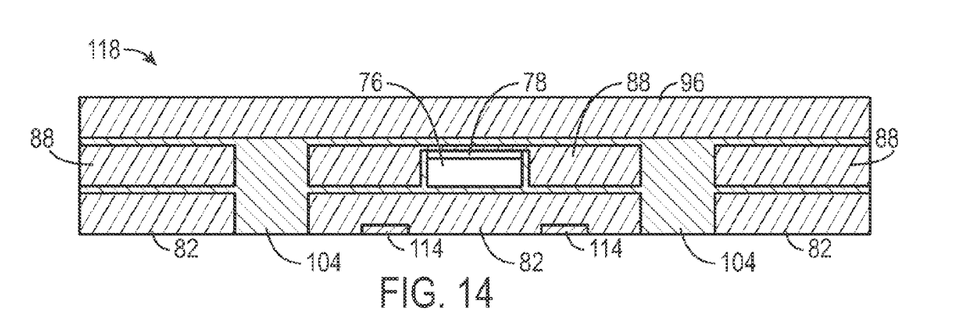
FIG. 14 is a cross-sectional view of the PCB formed using the method of FIG. 11 for manufacturing the PCB, in accordance with an embodiment.

Accordingly, a PCB assembly 118 is formed, as illustrated in FIG. 14. The PCB assembly 118 includes the cured resin 104 disposed between the layers 82, 88, and 96 and attaching the layers together. As will be appreciated, the cured resin 104 is configured to inhibit liquids (e.g., water) from contacting the die assembly 74. As illustrated, the PCB assembly 118 includes the die assembly 74 embedded therein. The conductive pads 64 of the die assembly 74 are coupled to conductive traces disposed in the first layer 82 so that signals may be applied to the conductive pads 64. Furthermore, the conductive traces of the PCB assembly 118 may be arranged so that the die assembly 74 may be tested by accessing the test pads 114. Therefore, the operation of the die assembly 74 may be tested by using the test pads 114.

Technical effects of the present disclosure include, among other things, a reduction in the movement, twisting, and/or sliding of the die 62 when the die 62 is attached to another surface. By reducing the change in position of the die 62, the conductive pads 64 of the die 62 may more accurately contact conductive traces of the PCB. Furthermore, the die 62 may be embedded inside of a multi layer PCB using a single press cycle, thereby reducing the time taken to form the PCB assembly. In addition, the embedded die 62 may be protected from contact with liquids by the resin used within the PCB assembly.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A printed circuit board (PCB) for an electronic device comprising:
    a first layer;
    a die assembly disposed on the first layer, wherein the die assembly comprises an adhesive layer that contacts the first layer;
    a second layer disposed over the first layer such that the die assembly is between the first layer and the second layer; and
    a cured resin disposed between the first layer and the second layer, wherein the cured resin is configured to inhibit liquid from contacting the die assembly and to attach the first layer to the second layer, and wherein the cured resin and the adhesive layer are formed from different materials.

2. The PCB of claim 1, wherein the first layer comprises a plurality of test pads for testing operation of the die assembly after the cured resin is formed.

3. The PCB of claim 1, wherein the die assembly comprises conductive pads disposed on a side opposite the adhesive layer.

4. The PCB of claim 1, wherein the second layer comprises a plurality of test pads for testing operation of the die assembly after the cured resin is formed.

5. The PCB of claim 1, wherein the first layer comprises a first opening configured to align with a second opening of the second layer.

6. A printed circuit board (PCB) for an electronic device comprising:
    a first layer comprising a first alignment feature;
    a die assembly disposed on the first layer, wherein the die assembly comprises an adhesive layer that contacts the first layer;
    a second layer that is formed from a single dielectric material and that comprises a second alignment feature disposed over the first layer and the die assembly such that the die assembly is within a middle portion between the first layer and the second layer, wherein the first alignment feature of the first layer is aligned with the second alignment feature of the second layer; and
    an epoxy disposed between the first layer and the second layer, wherein the epoxy is configured to be cured during a press cycle applied to the PCB.

7. The PCB of claim 6, wherein
the first alignment feature comprises a first opening and the second alignment feature comprises a second opening.

8. The PCB of claim 6, wherein the first layer comprises a core material, a prepreg material, a conductive material, or some combination thereof.

9. The PCB of claim 6, wherein the first layer comprises a core material and the second layer comprises a prepreg material.

10. A printed circuit board (PCB) for an electronic device comprising: a first layer;
    a die assembly disposed on the first layer, wherein only an adhesive layer is interposed between the die assembly and the first layer;
    a second layer disposed over the first layer such that the die assembly is within an central portion between the first layer and the second layer;
    a third layer disposed over the second layer;
    a cured resin between the first layer, the second layer, and the third layer wherein the cured resin is formed during a press cycle applied to the PCB and the cured resin is configured to inhibit liquid from contacting the die assembly, to attach the first layer to the second layer, and to attach the second layer to the third layer; and
    a plurality of test pads disposed on the first layer, the second layer, the third layer, or some combination thereof, wherein the plurality of test pads are configured to be used to test the operation of the die assembly before being covered by additional PCB layers.

11. The PCB of claim 10, wherein the plurality of test pads comprises a first test pad disposed on the third layer and a second test pad disposed on the third layer.

12. The PCB of claim 10, wherein the die assembly comprises conductive pads electrically coupled to a conductive portion of the second layer.

* * * * *